United States Patent [19]
Pawlik et al.

[11] 4,115,162
[45] Sep. 19, 1978

[54] PROCESS FOR THE PRODUCTION OF EPITAXIAL LAYERS ON MONOCRYSTALLINE SUBSTRATES BY LIQUID-PHASE-SLIDE EPITAXY

[75] Inventors: Dieter Pawlik, Munich; Karl-Heinz Zschauer, Grafing, both of Germany

[73] Assignee: Siemens Aktiengesellschaft, Berlin & Munich, Germany

[21] Appl. No.: 833,052

[22] Filed: Sep. 14, 1977

[30] Foreign Application Priority Data

Sep. 14, 1976 [DE] Fed. Rep. of Germany ....... 2641347

[51] Int. Cl.$^2$ ............................................. H01L 21/208
[52] U.S. Cl. .................................. 148/171; 148/172; 427/86
[58] Field of Search ................................ 148/171, 172; 252/63.5 GA; 427/86

[56] References Cited

U.S. PATENT DOCUMENTS

| 3,753,801 | 8/1973 | Lockwood et al. | 148/171 |
| 3,832,225 | 8/1974 | Matsui et al. | 148/171 X |
| 3,951,700 | 4/1976 | Beppu et al. | 148/171 |
| 3,960,618 | 6/1976 | Kawamura et al. | 148/171 |
| 4,050,964 | 9/1977 | Rode | 148/171 |

*Primary Examiner*—G. Ozaki
*Attorney, Agent, or Firm*—Hill, Gross, Simpson, Van Santen, Steadman, Chiara & Simpson

[57] ABSTRACT

A process or method for the production of epitaxial layers on a monocrystalline substrate by moving a melt on a surface of the substrate, depositing the layer and then removing the remaining melt from the substrate characterized by the substrate being a crystal having two boundary edges, which are parallel to one another and in which no preferred edge growth occurs in a direction running at right angles to the boundary edges and pointing outward from the interior of the substrate crystal so that no portion of the melt will be retained as the melt is being removed after forming the layer.

12 Claims, 10 Drawing Figures

PROCESS FOR THE PRODUCTION OF EPITAXIAL LAYERS ON MONOCRYSTALLINE SUBSTRATES BY LIQUID-PHASE-SLIDE EPITAXY

BACKGROUND OF THE INVENTION

1. Field of the Invention

The present invention is directed to an improved method for the production of epitaxial layers on a monocrystalline substrate by shifting a slide in one direction to move a melt onto a surface of the substrate, depositing a monocrystalline epitaxial layer of material from the melt onto the surface of the substrate and subsequently moving the slide in said one direction to remove the remaining portion of the melt.

2. Prior Art

In order to produce specific semiconductor components, for example, luminescent diodes or laser diodes, it is necessary to epitaxially deposit one or more layers of semiconductor material upon a semiconductor crystal. To accomplish this, a "liquid-phase-slide epitaxy" technique or process is used and is particularly useful for the production of semiconductor components consisting of intermetallic III-V compounds and alloys thereof. In this method, a slide is used to move the melt containing the material to be deposited onto the surface of the substrate and then a layer of the material is deposited on the surface by a slight cooling of the melt. As soon as the layer thickness is deposited, the remaining melt with the aid of the slide is moved away from the substrate surface and the grown epitaxial layer that was deposited thereon. A slide-epitaxy-process of the above mentioned type and a device for accomplishing or executing this process is described in U.S. Pat. No. 3,753,801.

In the production of heterostructure laser diodes, it is necessary to epitaxially deposit a plurality of layers one upon the other. These layers differ in their composition for example the aluminum content in the case of a GaAs-(GaAl)As layer sequence. One of the factors, which determines the properties of the laser diode of this type, is the sharp change in the composition at the heterojunction between the two epitaxial layers. A laser diode having good optical and electrical properties necessitates extremely sharp heteroboundaries. In the conventional slide epitaxy process, undefied heteroboundaries occur due to the fact that during the shifting away of a melt for the $Ga_{1-x}Al_xAs$ layer wherein $0 \leq x \leq 1$, the melt is not completely removed from the grown epitaxial GaAlAs layer and a slight residue of the melt is left thereon. This melt residue, which remains on the surface of the deposited epitaxial layer, will become mixed with the new GaAs melt, which is subsequently applied for deposition of the next epitaxial GaAs layer. This results in a graded heterojunction between the $Ga_{1-x}Al_xAs$ layer and the GaAs layer, e.g. the aluminum content does not drop abruptly to 0 but requires a range of 0.1 to 0.3 $\mu$m to decrease or change from $x$ amount to a 0 amount. Poorly defined heterojunctions of this type lead to considerably straying threshold current densities and a low (differential) external efficiency.

SUMMARY OF THE INVENTION

The present investigation is directed to a method which provides improvements in a liquid-phase epitaxy process that prevents the dragover of melt residues from one melt to another one and enables depositing a plurality of epitaxial layers one upon the other with each of the layers having sharply defined heteroboundaries therebetween.

To accomplish this aim, the present invention is directed to a method for the production of epitaxial layers on monocrystalline substrates by a liquid-phase-slide-epitaxy process which includes providing a monocrystalline substrate having a surface, shifting a slide in one direction to move a melt onto said surface, depositing a monocrystalline epitaxial layer of material from the melt onto the surface of the substrate, and subsequently moving the slide in said one direction to remove the remaining portion of the melt from the substrate and a layer deposited thereon with the improvements comprising wherein said step of providing a substrate provides a crystal having a surface with at least two boundary edges, which are parallel to one another and in which no preferred edge growth occurs in the direction $N_1$, $N_1'$ running at right angles to these boundary edges and pointing outward from the interior of the substrate crystal, and wherein the step of moving the slide moves the slide in a direction relative to the boundary edges so that the melt moves across the boundary edges as it is being applied to and removed from the surface of the crystal.

The present invention is based on the recognition that the dragover of the melt, which occurs during a slide epitaxy, is caused by irregular growth or beads at the edge of the deposited, epitaxial layer. A bead growth occurs at the edges of the deposited epitaxial layer as the angle of wetting of the melt with the substrate is greater than a right angle and consequently the edges possess a larger catchment area for the material to be deposited than the remainder of the surfaces of the substrate. Since it is necessary to move the melt across these beaded edges, melt residues will remain suspended on the bead like edges as a result of the surface tension of the melt. The degree of drag-over of the melt is dependent on the size of the gap between the base of the melt slide and the surface of either the substrate or the surface of the grown epitaxial layer on the surface of the substrate. This gap cannot be kept as small as possible due to the fact that as the melt is moved away by the slide parts, a portion of the bead can be broken away, if the gap is too small and the broken away portion may scratch the surface of the grown epitaxial layer. Scratches of this kind can lead to crystal structure faults, which in turn are responsible for degradation phenomena of the laser diodes.

The present invention is also based on the recognition that the bead growth which occurs at the edges of the substrate and the edges of the grown epitaxial layers is not uniform in all directions and that the speed of the crystal growth at the edges is dependent upon the spatial orientation of these edges. When the bead has a tangential plane, which is parallel to a crystal surface which is singular for the crystal growth, the bead growth or edge growth becomes particularly strong or rapid. In the case of GaAs, as singular crystal surface of this type consists in the (111) lattice surface or plane and the development of the singular surface causes the bead to grow. Therefore, in accordance with the present invention, the slide epitaxy substrates are selected so that they are split and sawed to a desired shape in such a manner that the boundary edges of the substrate surface are not those edges at which a rapid growth will mainly occur. Substrates, which have been cut to size in the above mentioned manner, are inserted into the slide epitaxy device in such a way that the melt moves across those edges of the substrate and the edges of the grown epitaxy layers, which edges have an edge growth that is very low. Then, during the epitaxy process, none or only very small beads are formed at such edges so that when the melt is moved away, no melt residue remains on the surface of the crystal. The bead growth, which occurs at the corner of the substrate and the grown crystal layer or at the edges lying parallel to the direction of shift of the melt, only inconsiderably influences the spreading of the melt as proved by investigations carried out in association with the invention. The dragover of the melt is mainly determined by beads, which lie at right angles to the direction of the shift of the melt and which must be moved across the melt.

The preferred embodiments of the invention are particularly useful for the production of III-V semiconductor crystals which possess a zinc blende lattice structure. In one embodiment, the layer growth is to take place in a <111> lattice direction and the substrate is inserted into the slide epitaxy apparatus in such a way that the direction of shift of the melt is at right angles to the crystal edge location in a (110) lattice or crystal plane. If the crystal growth is to take place in a <100> direction, the substrate crystal is cut to size and inserted into a slide epitaxy apparatus in such a manner that the boundary edge running at right angles to the direction of the shift of the melt forms an angle of between 15° and 45° to a <110> direction and preferably an angle of 45°. When the angle is at 45°, the boundary edge will lie in the <100> lattice direction.

DESCRIPTION OF THE PREFERRED EMBODIMENTS

The principles of the present invention are particularly useful in a method such as a liquid phase slide epitaxy process for producing epitaxial layers on a substrate including a $Ga_xAl_{1-x}As_yP_{1-y}$ wherein $0 \leq x \leq 1$ and $0 \leq y \leq 1$. In particular, the present invention will be described for a method of applying a GaAlAs epitaxial layer on a GaAs substrate.

Figure 1:
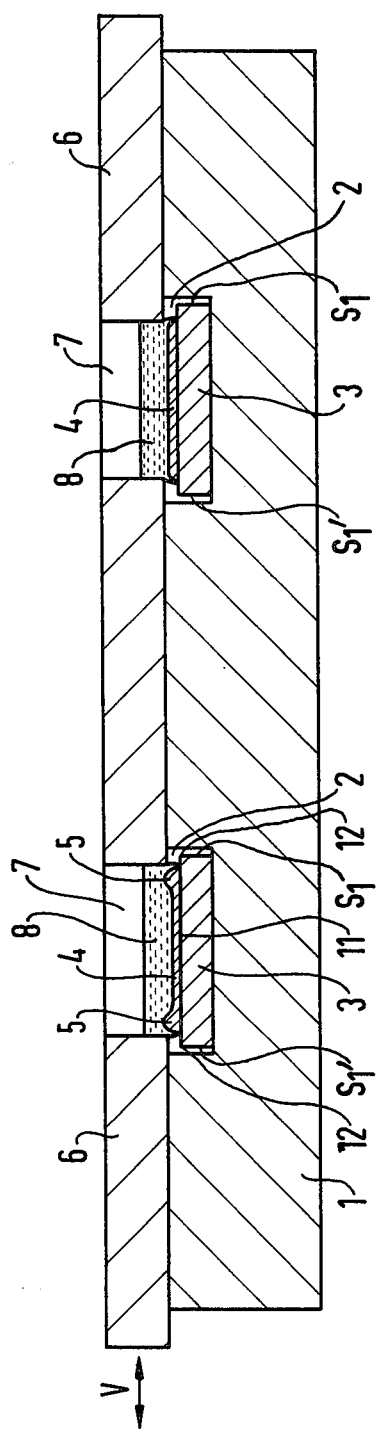
FIG. 1 is a cross sectional view of a device utilized in a slide epitaxy process.
Figure 2:
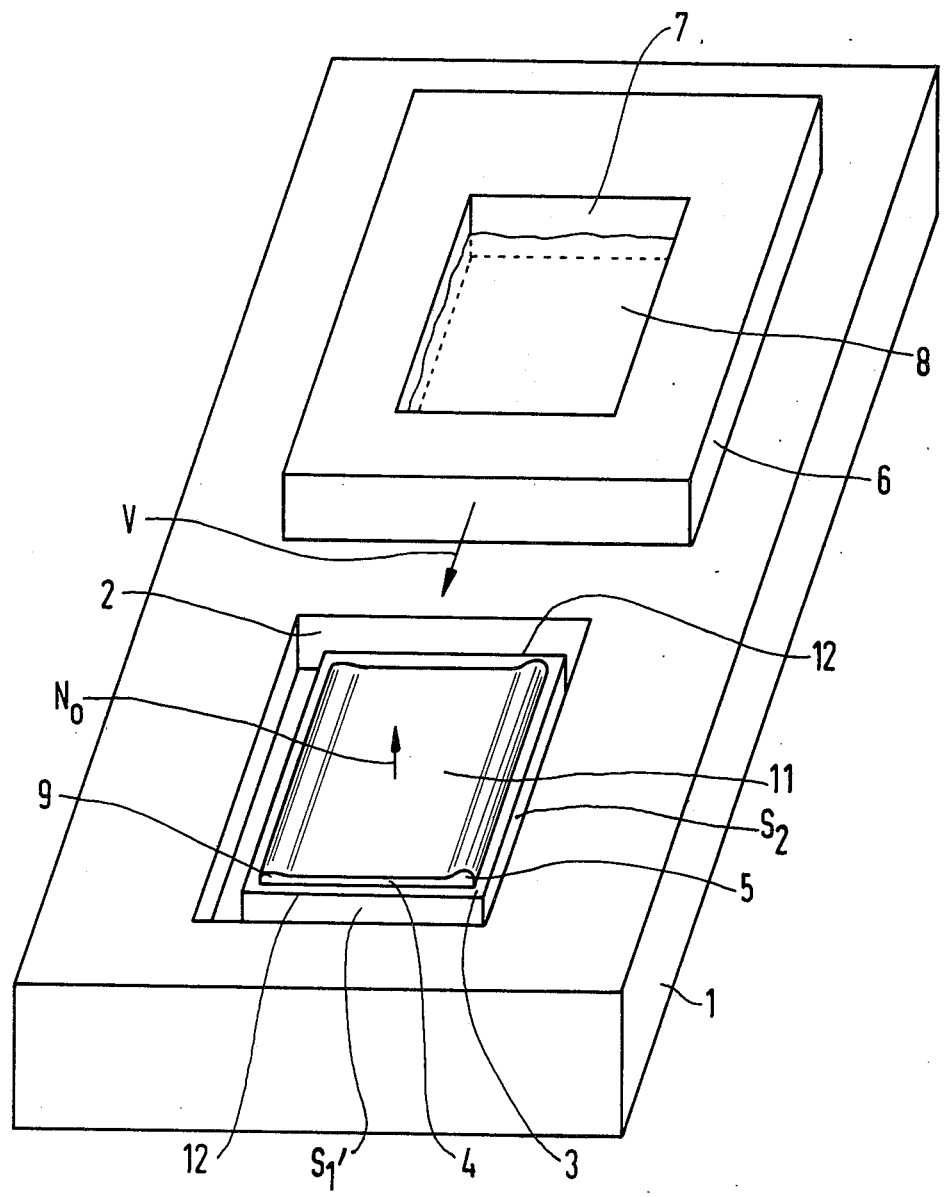
FIG. 2 is a perspective view of a device for a slide epitaxy process.

To perform the process, a slide epitaxial apparatus or device which serves to produce an epitaxial layer of the kind of the desired type is schematically illustrated in FIGS. 1 and 2. The device includes a carrier plate 1, which is provided with two recesses 2. A substrate crystal 3 is disposed in each of the recesses 2. A slide 6, which has openings 7 (two illustrated), is disposed on the upper surface of the carrier plate 1. These openings 7 will contain a melt 8 from which an epitaxial layer 4 is to be deposited onto a surface of the substrate 3.

As disclosed in greater detail in U.S. Pat. No. 3,753,801, the process starts with the temperature of the melt and the substrate in a range of approximately 800° C. By cooling the melt, below this temperature, a layer 4 is deposited on the substrates. As soon as a given layer thickness for the epitaxial layer 4 has been deposited, the slide 6 is moved in a direction V and thus the melt 8 is moved away from the grown layer 4.

Figure 3:
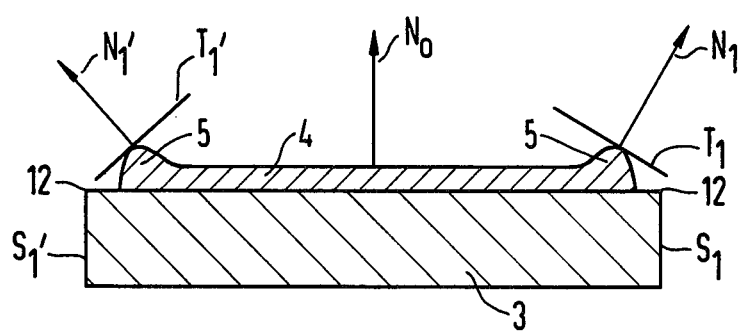
FIG. 3 is a cross sectional view of a substrate schematically illustrating bead growth occurring in a GaAs crystal.
Figure 4:
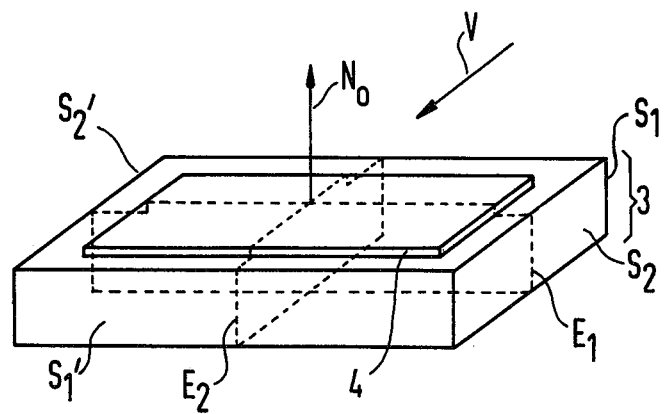
FIG. 4 is a perspective view of the substrate in accordance with the present invention.
Figure 5:
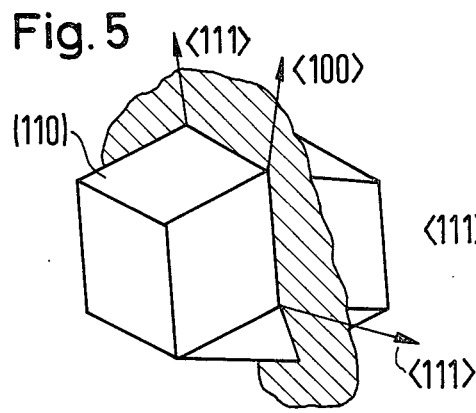
FIGS. 5 through 10 schematically illustrate how crystals having a zinc blende crystal lattice structure are split and the orientation with which they are inserted into a slide epitaxial apparatus or device relative to the direction of the application and removal of the melt with FIGS. 5 and 6 illustrating the process known from the prior art and FIGS. 7 through 10 showing two possible orientations in accordance with the present invention.
Figure 6:
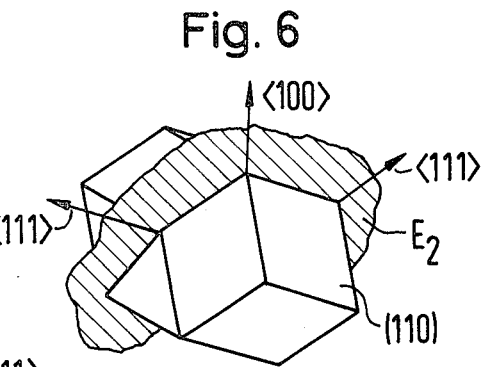

In accordance with the prior art, a GaAs substrate crystal is provided with the desired shape by cleaving. The lateral boundary surface of the substrate 3 whose surface normal $N_o$ points in a <100> direction, are cleavage faces $S_1$, $S_1'$, $S_2$, $S_2'$ (FIGS. 3 and 4). In the prior art the direction of the application and removal of the melt 8 is at right angles to one pair of the cleavage faces and parallel to the other pair. The cleavage faces are arranged in parallel with (110) crystal or lattice planes $E_1$ and $E_2$ (FIG. 4). The position of these planes in the unit cell bounded by the (110) crystal planes are represented in FIGS. 5 and 6. With lateral substrate boundary surface of this kind and during growth of an epitaxial layer 4, beads 5, which run transversely to the direction of the shift, are formed at all the layer edges and have tangential planes $T_1$, $T_1'$ (see FIG. 3) that extend parallel to the (111) crystal surface or lattice plane.

These beads prevent the removal of the melt 8, so that the residue of a GaAlAs melt will remain on the deposited layer and become mixed with the GaAs melt which is then applied thereafter to form the next layer. This mixture of the two melts provides a poorly defined heterojunction. Furthermore, in an unfavorable situation, the bead formation can be so strong that during the movement of the slide 6, it will strike against the bead and break portions off. When the melt is removed these broken parts of the bead 5 can scratch the surface of the epitaxial layer 4, and thus render the layer 4 unserviceable or unacceptable.

Figure 7:
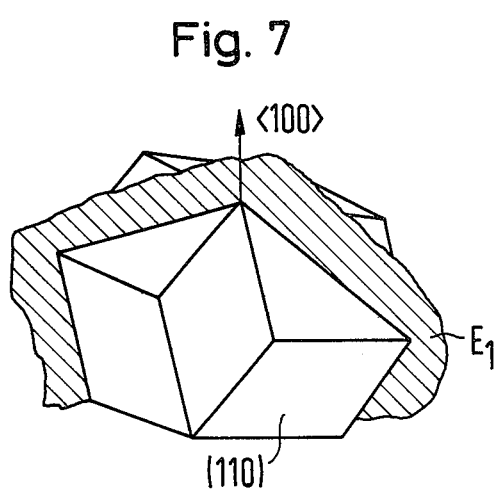
Figure 8:
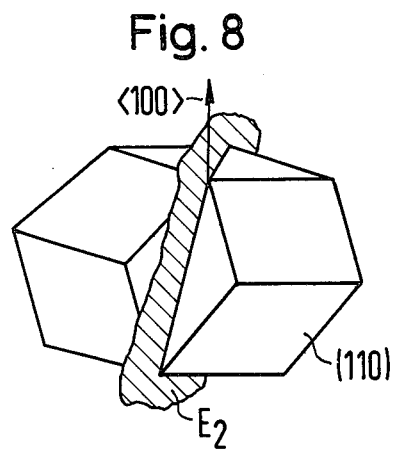

In order to avoid this disturbing bead growth in accordance with the present invention, a substrate, which has a zinc blende lattice structure, for example a GaAs structure, whose surface is a (100) lattice surface, is cut to shape, for example, sawed in such a manner that the lateral boundary surfaces $S_1$ and $S_1'$ form an angle of between 15° and 45° with a (110) lattice surface. Preferably they form a 45° angle and in this case the lateral boundary surfaces $S_1$ and $S_1'$ will extend parallel to the (100) lattice surface. The two other lateral boundary surfaces $S_2$ and $S_2'$ are positioned at right angles to the surfaces $S_1$ and $S_1'$ and thus in the preferred construction likewise will approach a (110) lattice plane at an angle of 45°. The substrate, which has been sawed to a size in this manner, is now inserted into a slidingboat epitaxy apparatus or device in such a manner that the direction V in which the melt is applied to and removed from the substrate surface is at right angles to the surfaces $S_1$ and $S_1'$. In FIGS. 7 and 8, crystal models illustrate how the crystal surface $E_1$, which is parallel to the boundary surface $S_1$ and $S_1'$ and the crystal surface $E_2$, which is parallel to the boundary surfaces $S_2$ and $S_2'$ passes through the crystal lattice.

Figure 9:
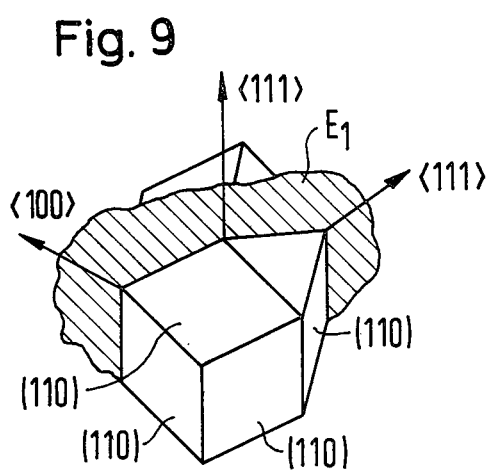
Figure 10:
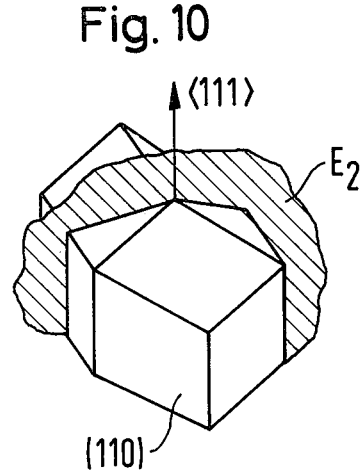

If, the epitaxial growth in a GaAs substrate is to take place in a <111> crystal or lattice direction, in accordance with the further development of the invention, a substrate having an (111) oriented surface 11 is cut in such a manner that the lateral boundary surfaces $S_1$ and $S_1'$ (FIG. 4) are cleavage faces of the crystal. The two other boundary surfaces $S_2$ and $S_2'$ are positioned at right angles to these cleavage faces by an appropriate cutting of the crystal. The crystal models in FIGS. 9 and 10 illustrate how the crystal surface $E_1$, which is parallel to the boundary surfaces $S_1$ and $S_1'$, and the crystal surface $E_2$, which is parallel to the boundary surfaces $S_2$ and $S_2'$, pass through the crystal.

The substrate is now inserted into the slide epitaxial apparatus in such a manner that the direction of shift V runs at right angles to the (110) crystal or lattice plane (FIG. 4). When the substrate 3 is in this position, the edges 12 over which the melt is applied and removed, constitute cut edges of a (110) lattice plane with the (111) lattice plane forming the surface of the substrate. The small (111) tangential planes can be applied to this edge 12 so that no bead growth occurs at these edges. The two other lateral boundary surfaces $S_2$ and $S_2'$ in this example run at right angles to the boundary surfaces $S_1$ and $S_1'$. In the preferred embodiment, they cut the (111) surface plane of the substrate in a <110> edge direction. A (111) oriented tangential plane having a normal $N_1$ pointing away from the substrate (compared with FIG. 3) can in this case only be applied to one of these edges $S_2$, $S_2'$. The other of these two edges can only obtain a (100) plane as its tangential plane. Therefore, during the epitaxial process, a small bead 9 and a thicker bead 5 grow in the direction which is parallel to the slide direction V (see FIG. 2). Since these beads lie in the shift direction V, they do not lead to a disturbing spreading of the melt.

Although various minor modifications might be suggested by those versed in the art, it should be understood that we wish to employ within the scope of the patent granted hereon all such modifications as reasonably and properly come within the scope of our contribution to the art.

We claim:

1. In a method for the production of epitaxial layers on monocrystalline substrates by a liquid-phase-slide epitaxy process, said method including providing a monocrystalline substrate having a surface, shifting a slide in one direction to move a melt onto said surface, depositing a monocrystalline, epitaxial layer of material from the melt onto the surface of the substrate, and subsequently moving the slide in said one direction to remove the remaining portion of the melt from the substrate and layer deposited thereon, the improvement comprising the step of providing a substrate provides a crystal having a surface with at least two boundary edges which are parallel to one another and in which no preferred edge growth occurs in a direction $N_1$, $N_1'$ running at right angles to the boundary edges, and pointing outward from the interior of the substrate crystal, and wherein the step of moving the slide moves the slide in a direction relative to the boundary edges so that the melt moves across said boundary edges as it is being applied to and removed from the surface of the crystal.

2. In a method according to claim 1, wherein the substrate is a crystal having a zinc blende lattice structure, said surface having an orientation of a (111) lattice plane, each of said surface boundaries edges lying in a (110) lattice plane and the step of moving the slide moves the melt in a direction extending parallel to a <110> lattice direction.

3. In a method according to claim 1, wherein the substrate is a crystal having a zinc blende lattice structure, said surface being oriented in a (100) lattice plane, each of the boundary edges of the surface form an angle of approximately 15° to 45° to a <110> lattice direction of the substrate crystal.

4. In a method according to claim 3, wherein substrate crystal is cut in such a way that the boundary edges lie in a <100> lattice direction of the crystal and that the application and removal of the melt takes place at right angles to this boundary edge.

5. In a method according to claim 1, wherein the said surface of the substrate crystal is a rectangular surface and possesses at least two boundary edges which are parallel to one another and which have minimal edge growth.

6. In a method according to claim 1, wherein the direction of movement of the slide is perpendicular to said boundary edges.

7. In a method according to claim 6, wherein the substrate crystal is a crystal having a zinc blende lattice structure with said surface lying in a (111) lattice plane, said surface boundary edges lying in (110) lattice planes and said melt being moved by the slide in a <110> lattice direction across said boundary edges.

8. In a method according to claim 6, wherein the crystal of the substrate is a crystal having a zinc blende lattice structure, said surface being oriented in a (100) lattice plane, at least one of said boundary edges forming an angle of approximately 15° to 45° to a <110> lattice direction of the crystal and said melt being moved by said slide across said one boundary edge.

9. A process according to claim 1, wherein the substrate crystal consists of a crystal of a III-V compound.

10. In a method according to claim 1, wherein the crystal of the substrate is a compound of $Ga_xAl_{1-x}As_yP_{1-y}$ wherein $0 \leq x \leq 1$ and $0 \leq y \leq 1$.

11. A method according to claim 1, wherein said substrate is a semiconductor crystal and said method includes applying a second epitaxial layer on said first layer to form a semiconductor crystal having a heterostructure.

12. In a method according to claim 1, wherein the substrate is a semiconductor crystal of a III-V compound and said method includes applying a second epitaxial layer on the first layer to form a semiconductor crystal having a heterostructure.

* * * * *